US012580556B2

(12) United States Patent
Tsai et al.

(10) Patent No.: US 12,580,556 B2
(45) Date of Patent: Mar. 17, 2026

(54) MULTI-GAIN STAGE CIRCUIT AND ASSOCIATED CALIBRATION METHOD

(71) Applicant: Realtek Semiconductor Corp., HsinChu (TW)

(72) Inventors: Tzung-Ling Tsai, HsinChu (TW); Chih-Lung Chen, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 112 days.

(21) Appl. No.: 18/537,812

(22) Filed: Dec. 13, 2023

(65) Prior Publication Data

US 2024/0223173 A1 Jul. 4, 2024

(30) Foreign Application Priority Data

Dec. 28, 2022 (TW) .................................. 111150376

(51) Int. Cl.
*H03K 5/22* (2006.01)
*H03K 5/02* (2006.01)
(52) U.S. Cl.
CPC ................. *H03K 5/22* (2013.01); *H03K 5/02* (2013.01)

(58) Field of Classification Search
CPC ................................... H03K 5/22; H03K 5/02
See application file for complete search history.

(56) References Cited

U.S. PATENT DOCUMENTS

| | | | | |
|---|---|---|---|---|
| 6,756,924 | B2 * | 6/2004 | Lee ..................... | H03F 3/45995 341/122 |
| 2005/0270092 | A1 * | 12/2005 | Bailey ................. | H03F 3/45928 330/129 |
| 2009/0212983 | A1 | 8/2009 | Fukuzawa | |

* cited by examiner

*Primary Examiner* — Daniel C Puentes
(74) *Attorney, Agent, or Firm* — Winston Hsu

(57) ABSTRACT

A multi-gain stage circuit is arranged to receive an input signal to generate an output signal, and includes a first gain stage, a second gain stage, a gain control circuit, and a calibration circuit. The second gain stage is connected in series with the first gain stage, and the second gain stage generates the output signal. The gain control circuit controls the first gain stage to have a first gain value such that the output signal is regarded as a product of a gain value of the second gain stage and an offset voltage of the second gain stage. The calibration circuit calculates the offset voltage of the second gain stage according to the output signal, and calibrates the second gain stage according to the offset voltage of the second gain stage calculated by the calibration circuit.

18 Claims, 7 Drawing Sheets

MULTI-GAIN STAGE CIRCUIT AND ASSOCIATED CALIBRATION METHOD

BACKGROUND OF THE INVENTION

1. Field of the Invention

The present invention is related to offset voltage calibration of a multi-gain stage circuit, and more particularly, to a multi-gain stage circuit and an associated calibration method that can utilize output signals of the multi-gain stage to calculate an offset voltage of each gain stage without setting additional paths.

2. Description of the Prior Art

For a conventional multi-gain system, in order to calibrate an offset voltage of each gain stage, additional paths and associated control circuits are required to obtain an output signal of each gain stage and perform detection and offset voltage calibration upon each gain stage. However, this may increase complexity of the system and manufacturing costs, and the additional paths may cause additional loading effects on the original multi-gain stage, which may affect its performance.

SUMMARY OF THE INVENTION

It is therefore one of the objectives of the present invention to provide a multi-gain stage circuit and an associated calibration method that can utilize output signals of the multi-gain stage to calculate an offset voltage of each gain stage without setting additional paths, to address the above-mentioned issues.

According to an embodiment of the present invention, a multi-gain stage circuit is provided. The multi-gain stage circuit is arranged to receive an input signal to generate an output signal, and comprises a first gain stage, a second gain stage, a gain control circuit, and a calibration circuit. The second gain stage is connected in series with the first gain stage, and the second gain stage generates the output signal. The gain control circuit controls the first gain stage to have a first gain value such that the output signal is regarded as a product of a gain value of the second gain stage and an offset voltage of the second gain stage. The calibration circuit calculates the offset voltage of the second gain stage according to the output signal, and calibrates the second gain stage according to the offset voltage of the second gain stage calculated by the calibration circuit.

According to another embodiment of the present invention, a multi-gain stage circuit is provided. The multi-gain stage circuit is arranged to receive an input signal to generate an output signal, and comprises a first gain stage, a second gain stage, a third gain stage, a gain control circuit, and a calibration circuit. The first gain stage receives the input signal. The first gain stage, the second gain stage, and the third gain stage are connected in series with each other, and the third gain stage generates the output signal. The gain control circuit is arranged to control the second gain stage, wherein the gain control circuit controls the second gain stage to have a first gain value, and the calibration circuit receives the output signal to obtain a first equation; the gain control circuit controls the second gain stage to have a second gain value that is different from the first gain value, and the calibration circuit receives the output signal to obtain a second equation; and the calibration circuit calculates an offset voltage of the first gain stage and an offset voltage of the third gain stage according to the first equation and the second equation.

According to an embodiment of the present invention, a calibration method of a multi-gain stage circuit is provided, wherein the multi-gain stage circuit is arranged to receive an input signal to generate an output signal, the multi-gain stage circuit comprises a first gain stage and a second gain stage that are connected in series with each other, and the second gain stage generates the output signal. The calibration method comprises: controlling the first gain stage to have a first gain value so that the output signal is regarded as a product of a gain value of the second gain stage and an offset voltage of the second gain stage; and calculating the offset voltage of the second gain stage according to the output signal, and calibrating the second gain stage according to the offset voltage of the second gain stage.

One of the benefits of the present invention is that, by setting gain values of the gain stages and utilizing an output signal of the multi-gain stage circuit, an offset voltage of each gain stage is calculated and a calibration signal is generated to calibrate each gain stage. In this way, there is no need to set additional paths to perform the offset voltage calibration, and therefore the present invention can effectively reduce the complexity of the multi-gain stage circuit and its manufacturing costs.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
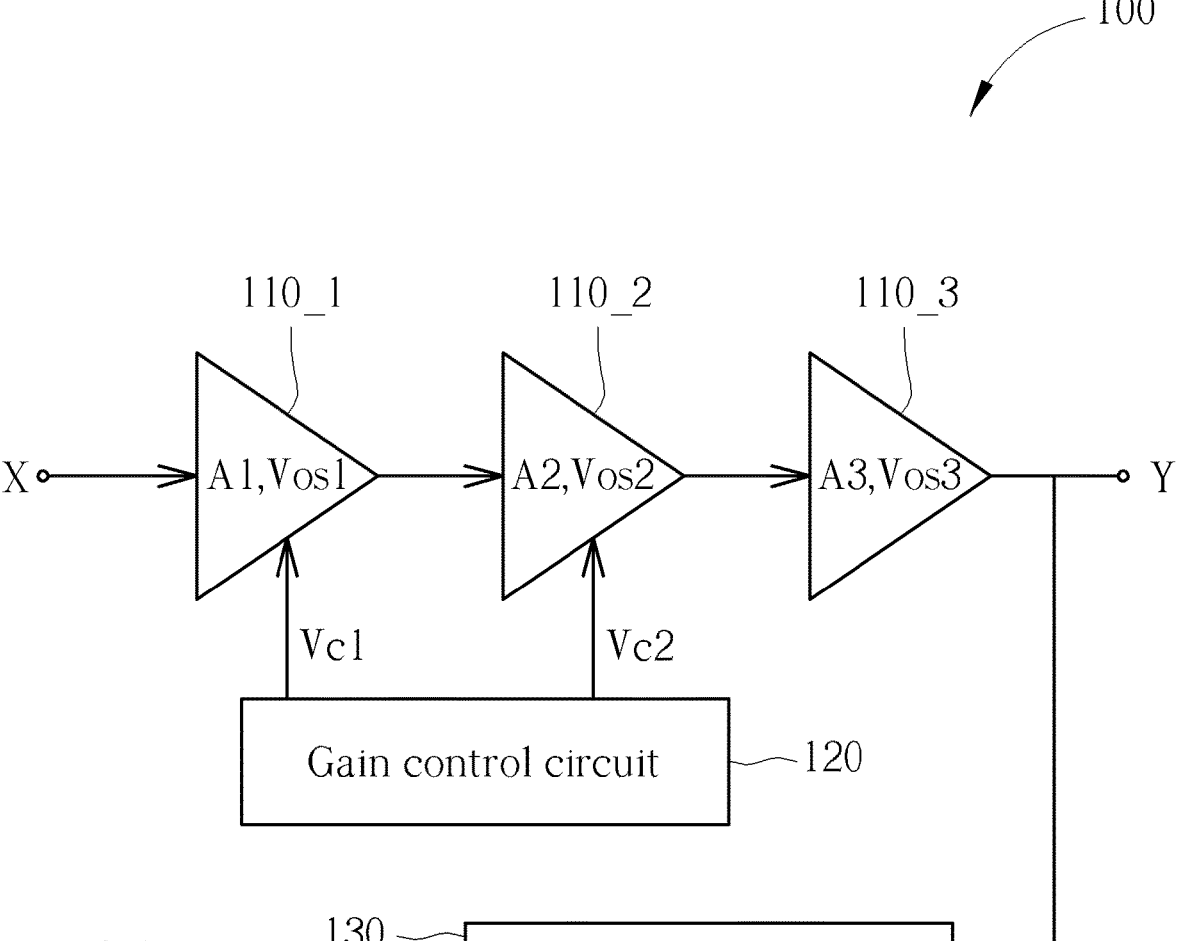
FIG. 1 is a diagram illustrating a multi-gain stage circuit according to an embodiment of the present invention.

FIG. 1 is a diagram illustrating a multi-gain stage circuit 100 according to an embodiment of the present invention. As shown in FIG. 1, the multi-gain stage circuit 100 includes gain stages 110_1-110_3, a gain control circuit 120, and a calibration circuit 130, wherein the gain stages 110_1-110_3 are connected in series with each other. The multi-gain stage circuit 100 is arranged to receive an input signal X and generate an output signal Y, and can be used in any circuit or electronic product needed to perform gain adjustment (e.g., an output stage of a communication chip). The gain stages 110_1-110_3 have gain values A1-A3, respectively, wherein at least the gain values A1 and A2 are adjustable gain values. In addition, any of the gain stages 110_1-110_3 may be a programmable gain amplifier (PGA), a filter, a digital-to-analog converter (DAC), or other suitable gain stages.

The gain stages 110_1-110_3 have individual offset voltages (e.g., input offset voltages). For example, the gain stage 110_1 has an offset voltage Vos1, the gain stage 110_2 has an offset voltage Vos2, and the gain stage 110_3 has an offset voltage Vos3, wherein the offset voltages Vos1-Vos3 may cause an offset of the input signal X, which will therefore cause distortion of the output signal Y. Assume that the input signal X is "0". Due to the offset voltage Vos1 of the gain stage 110_1, the output voltage of the gain stage 110_1 is not the ideal "0" but the Vos1*A1. As a result, the multi-gain stage circuit 100 is needed to be calibrated to cancel the offset voltages. In this embodiment, the multi-gain stage circuit 100 directly utilizes the output signal Y to calculate (or estimate) the offset voltages Vos1-Vos3 of the gain stages 110_1-110_3 by the gain control circuit 120 and the calibration circuit 130, and generates a calibration signal to calibrate the gain stages 110_1-110_3. Since there is no need to set additional paths to separately obtain the output signals of the gain stages 110_1 and 110_2, the present invention can effectively reduce complexity and manufacturing costs of the multi-gain stage circuit 100.

Figure 2:
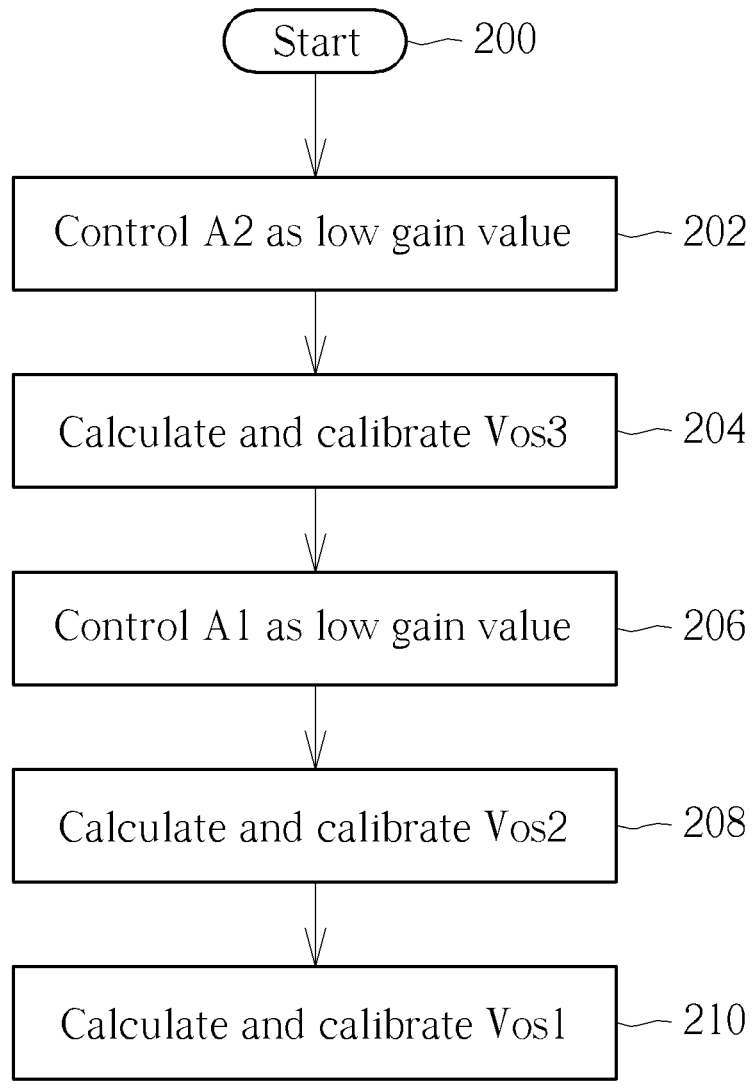
FIG. 2 is a flow chart of calibrating offset voltages of the gain stages shown in FIG. 1 according to an embodiment of the present invention.

FIG. 2 is a flow chart of calibrating offset voltages Vos1-Vos3 of the gain stages 110_1-110_3 shown in FIG. 1 according to an embodiment of the present invention.

In Step 200, the flow starts, and the multi-gain stage circuit 100 is powered on and starts to operate.

In Step 202, the gain control circuit 120 generates a gain control signal Vc2 to control the gain stage 110_2 to have a low gain value. For example, the gain control circuit 120 controls the gain stage 110_2 to have the lowest gain value that is allowable to be adjusted.

In Step 204, the calibration circuit 130 receives the output signal Y, calculates the offset voltage Vos3 of the gain stage 110_3 according to the output signal Y, and calibrates the gain stage 110_3 according to the offset voltage Vos3 calculated by the calibration circuit 130. In detail, the output signal Y can be expressed by the following equation (1):

$$Y = A3*(A2*(A1*(X+Vos1)+Vos2)+Vos3); \qquad (1)$$

wherein since the gain value A2 is the low gain value, the output signal Y in the equation (1) can be regarded as (e.g., approximated as) a product of the gain value A3 of the gain stage 110_3 and the offset voltage Vos3 of the gain stage 110_3 (i.e., A3*Vos3). Under a condition that the gain value A3 is known, the calibration circuit 130 may calculate the offset voltage Vos3 of the gain stage 110_3 according to the output signal Y. After the offset voltage Vos3 is calculated, the calibration circuit 130 may generate the calibration signal according to the calculated offset voltage Vos3, to calibrate the gain stage 110_3, so as to cancel the offset voltage Vos3. The calibration circuit 130 may achieve the offset voltage calibration by changing an input resistance of the gain stage 110_3, an input offset current, a common voltage, or a supply voltage. Since the offset voltage calibration is well known to those skilled in the art, further descriptions are not repeated in detail here.

In Step 206, after the gain stage 110_3 completes the offset voltage calibration, the gain control circuit 120 may generate a gain control signal Vc1 to control the gain stage 110_1 to have a low gain value. For example, the gain control circuit 120 controls the gain stage 110_1 to have the lowest gain value that is allowable to be adjusted. As this moment, the gain control circuit 120 may generate the gain control signal Vc2 to control the gain stage 110_2 to have any gain value.

In Step 208, the calibration circuit 130 receives the output signal Y, calculates the offset voltage Vos2 of the gain stage 110_2 according to the output signal Y, and calibrates the gain stage 110_2 according to the offset voltage Vos2 calculated by the calibration circuit 130. In detail, refer to the above-mentioned equation (1). Since the gain value A1 is the low gain value and the offset voltage Vos3 has been calibrated as a low value, the output signal Y in the equation (1) can be regarded as (e.g., approximated as) a product of the gain value A3 of the gain stage 110_3, the gain value A2 of the gain stage 110_2, and the offset voltage Vos2 of the gain stage 110_2 (i.e., A3*A2*Vos2). Under a condition that the gain values A2 and A3 are known, the calibration circuit 130 may calculate the offset voltage Vos2 of the gain stage 110_2 according to the output signal Y. After the offset voltage Vos2 is calculated, the calibration circuit 130 may generate the calibration signal according to the calculated offset voltage Vos2 to calibrate the gain stage 110_2 and therefore cancel the offset voltage Vos2.

In Step 210, after the gain stage 110_2 completes the offset voltage calibration, the calibration circuit 130 receives the output signal Y, calculates the offset voltage Vos1 of the gain stage 110_1 according to the output signal Y, and calibrates the gain stage 110_1 according to the offset voltage Vos1 calculated by the calibration circuit 130. At this moment, the gain control circuit 120 may generate the gain control signals Vc1 and Vc2 to control the gain stages 110_1 and 110_2 to have any gain values. In detail, refer to the above-mentioned equation (1). Under a condition that the offset voltages Vos2 and Vos3 have been calibrated as low values, the output signal Y in the equation (1) may be regarded as (e.g., approximated as) A3*A2*A1*(X+Vos1). Since the gain values A1, A2, A3 and the input signal X are known, the calibration circuit 130 may calculate the offset voltage Vos1 of the gain stage 110_1 according to the output signal Y. After the offset voltage Vos1 is calculated, the calibration circuit 130 may generate the calibration signal according to the calculated offset voltage Vos1 to calibrate the gain stage 110_1 and therefore cancel the offset voltage Vos1.

Figure 3:
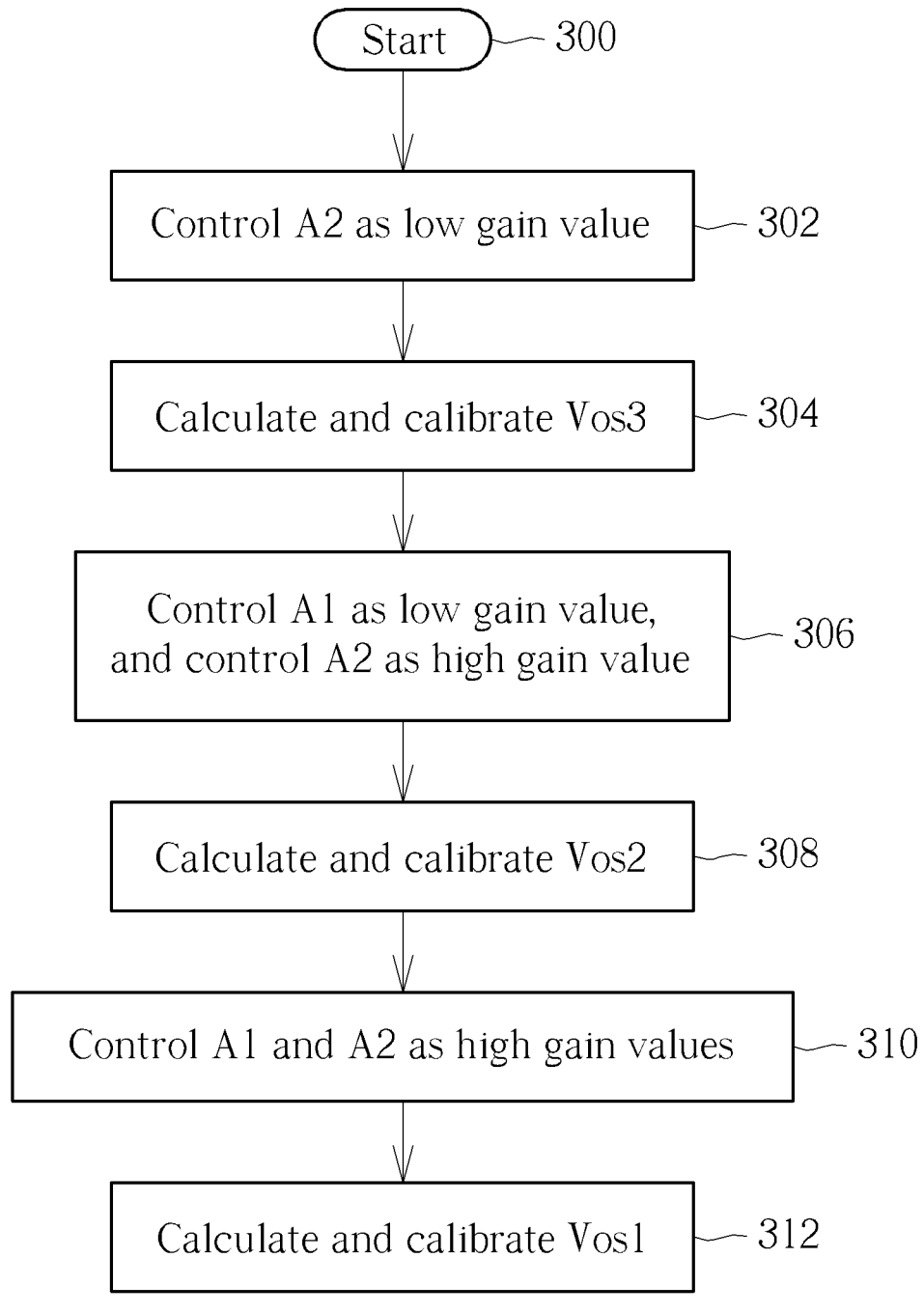
FIG. 3 is a flow chart of calibrating offset voltages of the gain stages shown in FIG. 1 according to another embodiment of the present invention.

The embodiment of FIG. 2 may effectively calibrate the offset voltages Vos1-Vos3 of the gain stages 110_1-110_3. However, under a condition that the gain stage 110_1 or the gain stage 110_2 may not be set as a lower gain value, there may be an error in the calculation of the offset voltages Vos1-Vos3. FIG. 3 is a flow chart of calibrating offset voltages Vos1-Vos3 of the gain stages 110_1-110_3 shown in FIG. 1 according to another embodiment of the present invention.

In Step 300, the flow starts, and the multi-gain stage circuit 100 is powered on and starts to operate.

In Step 302, the gain control circuit 120 generates the gain control signal Vc2 to control the gain stage 110_2 to have a low gain value. For example, the gain control circuit 120 controls the gain stage 110_2 to have the lowest gain value that is allowable to be adjusted.

In Step 304, the calibration circuit 130 receives the output signal Y, calculates the offset voltage Vos3 of the gain stage 110_3 according to the output signal Y, and calibrates the gain stage 110_3 according to the offset voltage Vos3 calculated by the calibration circuit 130. In detail, the output signal Y may be expressed as the above-mentioned equation (1). Since the gain value A2 is the low gain value, the output signal Y in the equation (1) may be regarded as (e.g., approximated as) A3*Vos3. Under a condition that the gain value A3 is known, the calibration circuit 130 may calculate the offset voltage Vos3 of the gain stage 110_3 according to the output signal Y. After the offset voltage Vos3 is calculated, the calibration circuit 130 may generate the calibration signal according to the calculated offset voltage Vos3 to calibrate the gain stage 110_3 and therefore cancel the offset voltage Vos3.

In Step 306, after the gain stage 110_3 completes the offset voltage calibration, the gain control circuit 120 generates the gain control signal Vc1 to control the gain stage 110_1 to have a low gain value. For example, the gain control circuit 120 controls the gain stage 110_1 to have the lowest gain value that is allowable to be adjusted. At this moment, the gain control circuit 120 generates the gain control signal Vc2 to control the gain stage 110_2 to have a high gain value. For example, the gain control circuit 120 controls the gain stage 110_2 to have the highest gain value that is allowable to be adjusted.

In Step 308, the calibration circuit 130 receives the output signal Y, calculates the offset voltage Vos2 of the gain stage 110_2 according to the output signal Y, and calibrates the gain stage 110_2 according to the calculated offset voltage Vos2. In detail, refer to the above-mentioned equation (1). Since the gain value A1 is the low gain value and the gain value A2 is the high gain value, the output signal Y in the equation (1) may still be regarded as (e.g., approximated as) A3*A2*Vos2 even though the offset voltage Vos3 cannot have a low value due to the calibration error. Under a condition that the gain values A2 and A3 are known, the calibration circuit 130 may calculate the offset voltage Vos2 of the gain stage 110_2 according to the output signal Y. After the offset voltage Vos2 is calculated, the calibration circuit 130 may generate the calibration signal according to the calculated offset voltage Vos2 to calibrate the gain stage 110_2 and therefore cancel the offset voltage Vos2.

In Step 310, after the gain stage 110_2 completes the offset voltage calibration, the gain control circuit 120 generates the gain control signals Vc1 and Vc2 to control the gain stages 110_1 and 110_2 to have high gain values. For example, the gain control circuit 120 controls the gain stages 110_1 and 110_2 to have the highest gain values allowable to be adjusted.

In Step 312, the calibration circuit 130 receives the output signal Y, calculates the offset voltage Vos1 of the gain stage 110_1 according to the output signal Y, and calibrates the gain stage 110_1 according to the offset voltage Vos1 calculated by the calibration circuit 130. In detail, refer to the above-mentioned equation (1). Under a condition that the gain values A1 and A2 are high gain values, the output signal Y in the equation (1) may still be regarded as (e.g., approximated as) A3*A2*A1*(X+Vos1) even though the offset voltages Vos2 and Vos3 cannot have low values due to the calibration error. Since the gain values A1, A2, A3 and the input signal X are known, the calibration circuit 130 may calculate the offset voltage Vos1 of the gain stage 110_1 according to the output signal Y. After the offset voltage Vos1 is calculated, the calibration circuit 130 may generate the calibration signal according to the calculated offset voltage Vos1 to calibrate the gain stage 110_1 and therefore cancel the offset voltage Vos1.

Figure 4:
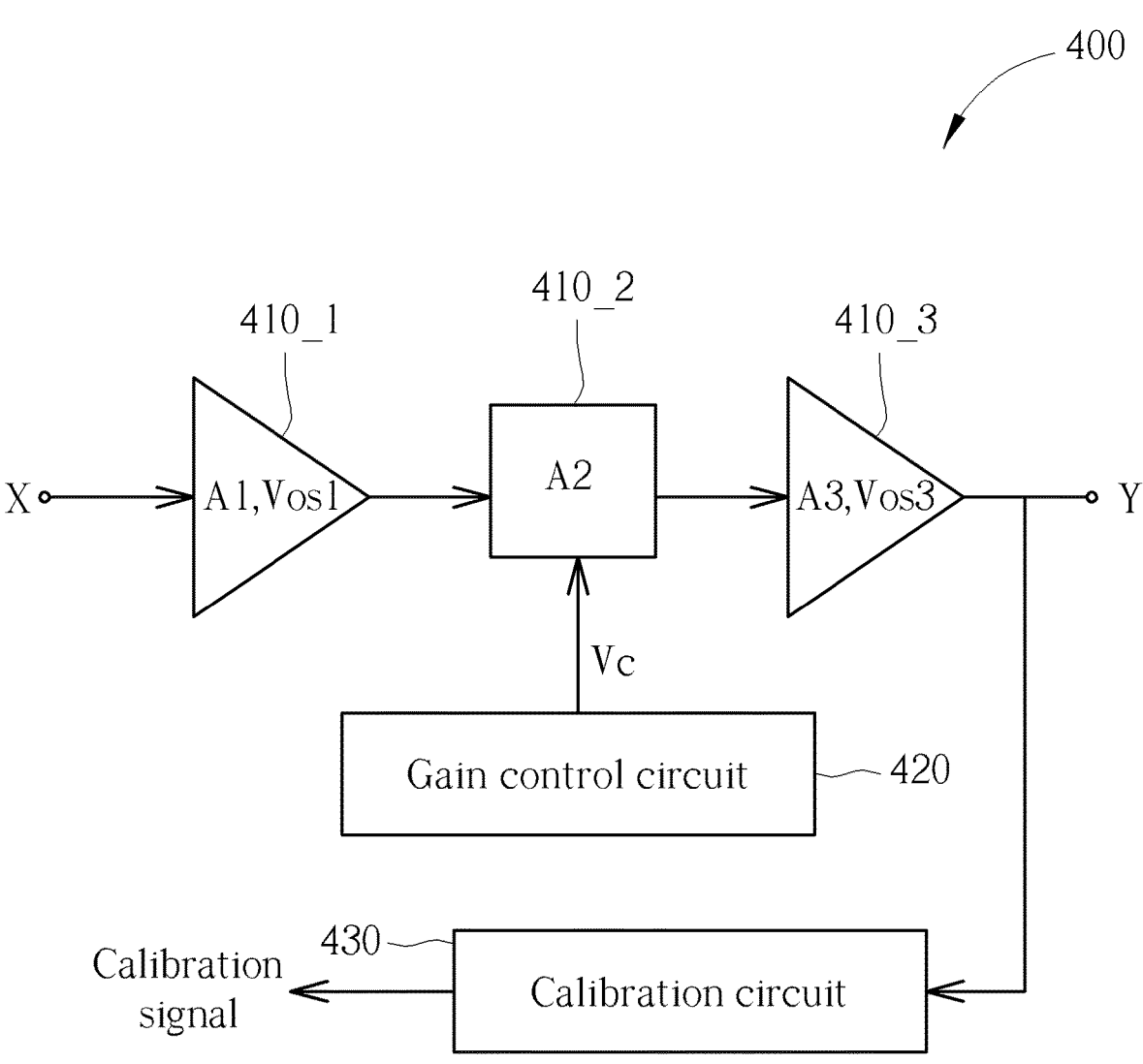
FIG. 4 is a diagram illustrating a multi-gain stage circuit according to another embodiment of the present invention.

FIG. 4 is a diagram illustrating a multi-gain stage circuit 400 according to another embodiment of the present invention. As shown in FIG. 4, the multi-gain stage circuit 400 includes gain stages 410_1-410_3, a gain control circuit 420, and a calibration circuit 430, wherein the gain stages 410_1-410_3 are connected in series with each other. The multi-gain stage circuit 400 is arranged to receive an input signal X and generate an output signal Y, and can be used in any circuit or electronic product needed to perform gain adjustment (e.g., an output stage of a communication chip). The gain stages 410_1-410_3 have gain values A1-A3, respectively, wherein at least the gain value A2 is an adjustable gain value. In addition, the gain stage 410_2 may be a passive filter.

The gain stages 410_1 and 410_3 have their own offset voltages (e.g., input offset voltages). For example, the gain stage 410_1 has an offset voltage Vos1, and the gain stage 410_3 has an offset voltage Vos3, wherein the offset voltages Vos1 and Vos3 may cause distortion of the output signal Y, and the multi-gain stage circuit 400 is needed to be calibrated to cancel the offset voltages Vos1 and Vos3. In addition, since the gain stage 410_2 is a passive component, the offset voltage of the gain stage 410_2 can be ignored. In this embodiment, the multi-gain stage circuit 400 directly utilizes the output signal Y to calculate (or estimate) the offset voltages Vos1 and Vos3 of the gain stages 410_1 and 410_3 by the gain control circuit 420 and the calibration circuit 430, and generates a calibration signal to calibrate the gain stages 410_1 and 410_3.

Figure 5:
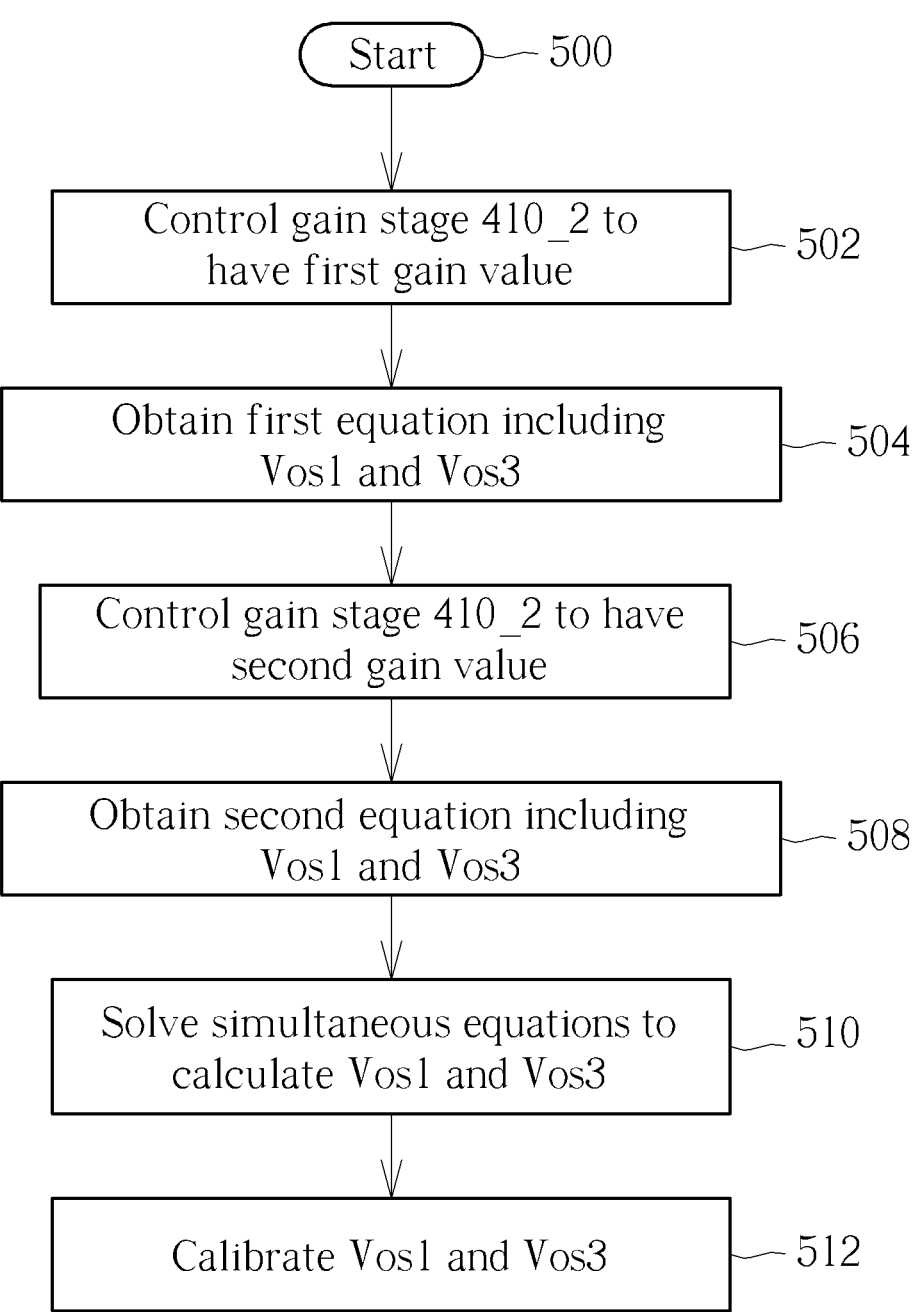
FIG. 5 is a flow chart of calibrating offset voltages of the gain stages shown in FIG. 4 according to an embodiment of the present invention.

FIG. 5 is a flow chart of calibrating offset voltages Vos1 and Vos3 of the gain stages 410_1 and 410_3 shown in FIG. 4 according to an embodiment of the present invention.

In Step 500, the flow starts, and the multi-gain stage circuit 400 is powered on and starts to operate.

In Step 502, the gain control circuit 420 generates a gain control signal Vc to control the gain stage 410_2 to have a first gain value A2_1.

In Step 504, the calibration circuit 430 receives the output signal Y of the multi-gain stage circuit 400 to obtain a first equation (2) including the offset voltages Vos1 and Vos3 as follows:

$$Y = A3*(A2\_1*(A1*(X + Vos1)) + Vos3); \qquad (2)$$

wherein the gain values A1, A2_1, A3, the input signal X, and the output signal Y are known.

In Step 506, the gain control circuit 420 generates the gain control signal Vc to control the gain stage 410_2 to have a second gain value A2_2.

In Step 508, the calibration circuit 430 receives the output signal Y of the multi-gain stage circuit 400 to obtain a second equation (3) including the offset voltages Vos1 and Vos3 as follows:

$$Y = A3*(A2\_2*(A1*(X + Vos1)) + Vos3); \qquad (3)$$

wherein the gain values A1, A2_2, A3, the input signal X, and the output signal Y are known.

In Step 510, since there are only two unknowns in total (i.e., the offset voltages Vos1 and Vos3) in the above-mentioned first equation and second equation, the calibration circuit 430 may solve the simultaneous equations to calculate the offset voltages Vos1 and Vos3.

In Step 512, after the offset voltages Vos1 and Vos3 are calculated, the calibration circuit 430 may generate the calibration signal according to the calculated offset voltages Vos1 and Vos3 to calibrate the gain stages 410_1 and 410_3 and therefore cancel the offset voltages Vos1 and Vos3.

Figure 6:
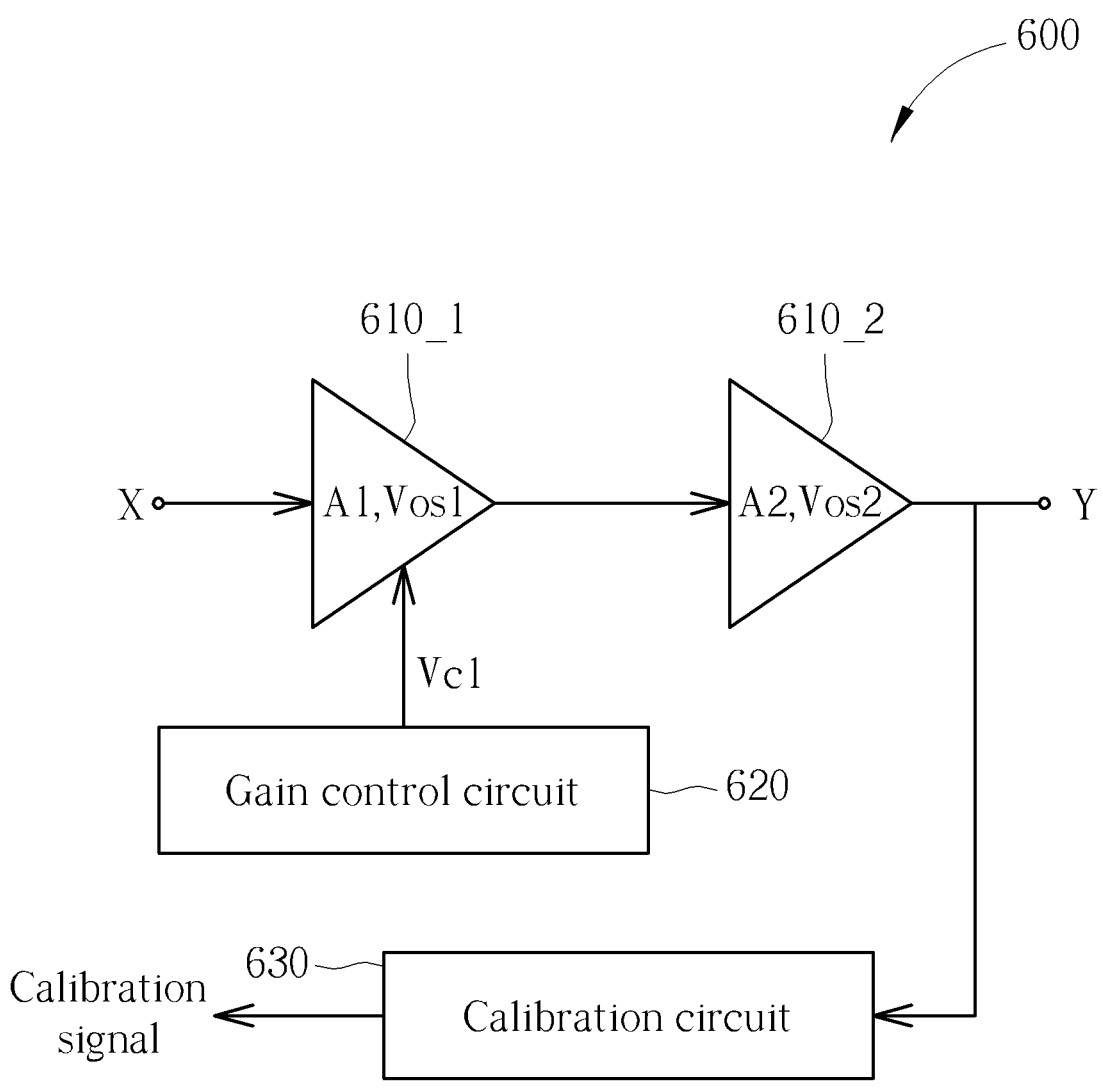
FIG. 6 is a diagram illustrating a multi-gain stage circuit according to yet another embodiment of the present invention.

FIG. 6 is a diagram illustrating a multi-gain stage circuit 600 according to yet another embodiment of the present invention. As shown in FIG. 6, the multi-gain stage circuit 600 includes gain stages 610_1, 610_2, a gain control circuit 620, and a calibration circuit 630, wherein the gain stages 610_1 and 610_2 are connected in series with each other. The multi-gain stage circuit 600 is arranged to receive an input signal X and generate an output signal Y, and can be used in any circuit or electronic product needed to perform gain adjustment (e.g., an output stage of a communication chip). The gain stages 610_1 and 610_2 have gain values A1 and A2, respectively, wherein at least the gain value A1 is an adjustable gain value.

The gain stages 610_1 and 610_2 have their own offset voltages (e.g., input offset voltages). For example, the gain stage 610_1 has an offset voltage Vos1, and the gain stage 610_2 has an offset voltage Vos2, wherein the offset voltages Vos1 and Vos2 cause an offset of the input signal X, which will therefore cause distortion of the output signal Y, and the multi-gain stage circuit 600 is needed to be calibrated to cancel the offset voltages Vos1 and Vos2. In this embodiment, the multi-gain stage circuit 600 directly utilizes the output signal Y to calculate (or estimate) the offset voltages Vos1 and Vos2 of the gain stages 610_1 and 610_2 by the gain control circuit 620 and the calibration circuit 630, and generates a calibration signal to calibrate the gain stages 610_1 and 610_2.

Figure 7:
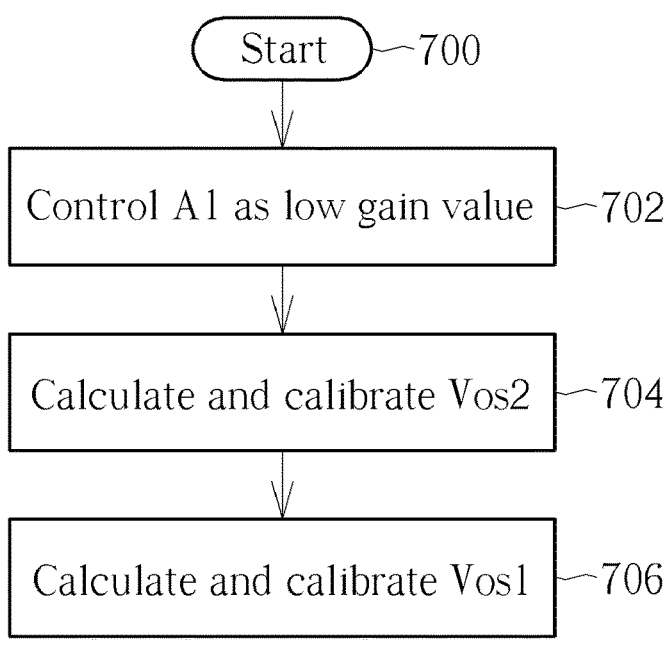
FIG. 7 is a flow chart of calibrating offset voltages of the gain stages shown in FIG. 6 according to an embodiment of the present invention.

FIG. 7 is a flow chart of calibrating offset voltages Vos1 and Vos2 of the gain stages 610_1 and 610_2 shown in FIG. 6 according to an embodiment of the present invention.

In Step 700, the flow starts, and the multi-gain stage circuit 600 is powered on and starts to operate.

In Step 702, the gain control circuit 620 generates a gain control signal Vc1 to control the gain stage 610_1 to have a low gain value. For example, the gain control circuit 620 controls the gain stage 610_1 to have the lowest gain value that is allowable to be adjusted.

In Step 704, the calibration circuit 630 receives the output signal Y, calculates the offset voltage Vos2 of the gain stage 610_2 according to the output signal Y, and calibrates the gain stage 610_2 according to the offset voltage Vos2 calculated by the calibration circuit 630. In detail, the output signal Y can be expressed by the following equation (4):

$$Y = A2*(A1*(X + Vos1) + Vos2);\qquad(4)$$

wherein since the gain value A1 is the low gain value, the output signal Y in the equation (4) can be regarded as (e.g., approximated as) a product of the gain value A2 of the gain stage 610_2 and the offset voltage Vos2 of the gain stage 610_2 (i.e., A2*Vos2). Under a condition that the gain value A2 is known, the calibration circuit 630 may calculate the offset voltage Vos2 of the gain stage 610_2 according to the output signal Y. After the offset voltage Vos2 is calculated, the calibration circuit 630 may generate the calibration signal according to the calculated offset voltage Vos2 to calibrate the gain stage 610_2 and therefore cancel the offset voltage Vos2.

In Step 706, after the gain stage 610_2 completes the offset voltage calibration, the calibration circuit 630 receives the output signal Y, calculates the offset voltage Vos1 of the gain stage 610_1 according to the output signal Y, and calibrates the gain stage 610_1 according to the offset voltage Vos1 calculated by the calibration circuit 630. At this moment, the gain control circuit 620 may generate the gain control signal Vc1 to control the gain stage 610_1 to have any gain value. In detail, refer to the above-mentioned equation (4). Under a condition that the offset voltage Vos2 has been calibrated as a low value, the output signal Y in the equation (4) may be regarded as (e.g., approximated as) A2*A1*(X+Vos1). Since the gain values A1, A2 and the input signal X are known, the calibration circuit 630 may calculate the offset voltage Vos1 of the gain stage 610_1 according to the output signal Y. After the offset voltage Vos1 is calculated, the calibration circuit 630 may generate the calibration signal according to the calculated offset voltage Vos1 to calibrate the gain stage 610_1 and therefore cancel the offset voltage Vos1.

Figure 8:
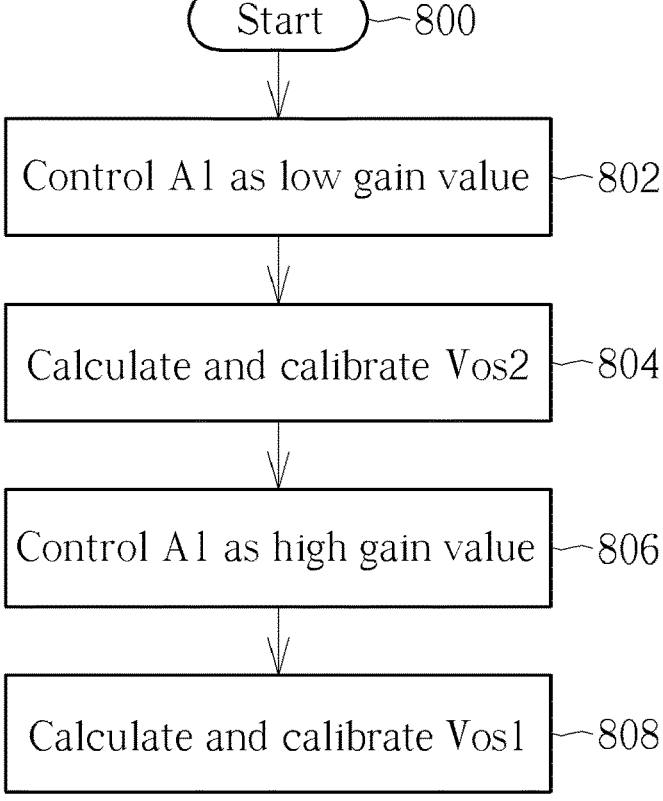
FIG. 8 is a flow chart of calibrating offset voltages of the gain stages shown in FIG. 6 according to another embodiment of the present invention.

The embodiment of FIG. 7 may effectively calibrate the offset voltages Vos1 and Vos2 of the gain stages 610_1 and 610_2. However, under a condition that the gain stage 610_1 may not be set as a lower gain value, there may be an error in the calculation of the offset voltages Vos1 and Vos2. FIG. 8 is a flow chart of calibrating offset voltages Vos1 and Vos2 of the gain stages 610_1 and 610_2 shown in FIG. 6 according to another embodiment of the present invention.

In Step 800, the flow starts, and the multi-gain stage circuit 600 is powered on and starts to operate.

In Step 802, the gain control circuit 620 generates the gain control signal Vc1 to control the gain stage 610_1 to have a low gain value. For example, the gain control circuit 620 controls the gain stage 610_1 to have the lowest gain value that is allowable to be adjusted.

In Step 804, the calibration circuit 630 receives the output signal Y, calculates the offset voltage Vos2 of the gain stage 610_2 according to the output signal Y, and calibrates the gain stage 610_2 according to the offset voltage Vos2 calculated by the calibration circuit 630. In detail, the output signal Y may be expressed as the above-mentioned equation (4). Since the gain value A1 is the low gain value, the output signal Y in the equation (4) may be regarded as (e.g., approximated as) A2*Vos2. Under a condition that the gain value A2 is known, the calibration circuit 630 may calculate the offset voltage Vos2 of the gain stage 610_2 according to the output signal Y. After the offset voltage Vos2 is calculated, the calibration circuit 630 may generate the calibration signal according to the calculated offset voltage Vos2 to calibrate the gain stage 610_2 and therefore cancel the offset voltage Vos2.

In Step 806, after the gain stage 610_2 completes the offset voltage calibration, the gain control circuit 620 generates the gain control signal Vc1 to control the gain stage 610_1 to have a high gain value. For example, the gain control circuit 620 controls the gain stage 610_1 to have the highest gain value allowable to be adjusted.

In Step 808, the calibration circuit 630 receives the output signal Y, calculates the offset voltage Vos1 of the gain stage 610_1 according to the output signal Y, and calibrates the gain stage 610_1 according to the offset voltage Vos1 calculated by the calibration circuit 630. In detail, refer to the above-mentioned equation (4). Under a condition that the gain value A1 is the high gain value, the output signal Y in the equation (4) may still be regarded as (e.g., approximated as) A2*A1*(X+Vos1) even though the offset voltage Vos2 cannot have a low value due to the calibration error. Since the gain values A1, A2, and the input signal X are known, the calibration circuit 630 may calculate the offset voltage Vos1 of the gain stage 610_1 according to the output signal Y. After the offset voltage Vos1 is calculated, the calibration circuit 630 may generate the calibration signal according to the calculated offset voltage Vos1 to calibrate the gain stage 610_1 and therefore cancel the offset voltage Vos1.

In summary, in the multi-gain stage circuit of the present invention, by setting gain values of the gain stages and utilizing an output signal of the multi-gain stage circuit, an offset voltage of each gain stage is calculated and a calibration signal is generated to calibrate each gain stage. In this way, there is no need to set additional paths to perform the offset voltage calibration, and therefore the present invention can effectively reduce the complexity of the multi-gain stage circuit and its manufacturing costs.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A multi-gain stage circuit, arranged to receive an input signal to generate an output signal, comprising:
   a first gain stage;
   a second gain stage, wherein the second gain stage is connected in series with the first gain stage, and the second gain stage generates the output signal;
   a gain control circuit; and
   a calibration circuit;
   wherein before calibrating an offset voltage of the first gain stage: the gain control circuit controls the first gain stage to have a first gain value such that the output signal is regarded as a product of a gain value of the second gain stage and an offset voltage of the second gain stage; and the calibration circuit calculates the offset voltage of the second gain stage according to the output signal, and calibrates the second gain stage according to the offset voltage of the second gain stage calculated by the calibration circuit.

2. The multi-gain stage circuit of claim 1, wherein the first gain value is a lowest gain value that is allowable to be adjusted of the first gain stage.

3. The multi-gain stage circuit of claim 1, wherein after the calibration circuit calibrates the second gain stage, the gain control circuit controls the first gain stage to have a highest gain value that is allowable to be adjusted, and the calibration circuit calculates the offset voltage of the first gain stage, and calibrates the first gain stage according to the offset voltage of the first gain stage calculated by the calibration circuit.

4. The multi-gain stage circuit of claim 1, wherein the multi-gain stage circuit further comprises a third gain stage; the first gain stage, the second gain stage, and the third gain stage are connected in series with each other, and the third gain stage receives the input signal; after the calibration circuit calibrates the second gain stage, the gain control circuit controls the third gain stage to have a second gain value so that the output signal is regarded as a product of the gain value of the second gain stage, a gain value of the first gain stage, and an offset voltage of the first gain stage; and the calibration circuit calculates an offset voltage of the first gain stage according to the output signal, and calibrates the first gain stage according to the offset voltage of the first gain stage calculated by the calibration circuit.

5. The multi-gain stage circuit of claim 4, wherein after the calibration circuit calibrates the first gain stage, the calibration circuit calculates an offset voltage of the third gain stage according to the output signal, and calibrates the third gain stage according to the offset voltage of the third gain stage calculated by the calibration circuit.

6. The multi-gain stage circuit of claim 1, wherein the multi-gain stage circuit further comprises a third gain stage; the first gain stage, the second gain stage, and the third gain stage are connected in series with each other, and the third gain stage receives the input signal; after the calibration circuit calibrates the second gain stage, the gain control circuit controls the third gain stage to have a second gain value and controls the first gain stage to have a third gain value, so that the output signal is regarded as a product of the gain value of the second gain stage, the third gain value of the first gain stage, and an offset voltage of the first gain stage; and the calibration circuit calculates the offset voltage of the first gain stage according to the output signal, and calibrates the first gain stage according to the offset voltage of the first gain stage calculated by the calibration circuit.

7. The multi-gain stage circuit of claim 6, wherein the second gain value is a lowest gain value that is allowable to be adjusted of the third gain stage, or the third gain value is a highest gain value that is allowable to be adjusted of the first gain stage.

8. The multi-gain stage circuit of claim 6, wherein after the calibration circuit calibrates the first gain stage, the gain control circuit controls the third gain stage to have a fourth gain value and controls the first gain stage to have a fifth gain value, and the calibration circuit calculates an offset voltage of the third gain stage according to the output signal, and calibrates the third gain stage according to the offset voltage of the third gain stage calculated by the calibration circuit.

9. The multi-gain stage circuit of claim 8, wherein the fourth gain value is a highest gain value that is allowable to be adjusted of the third gain stage, or the fifth gain value is a highest gain value that is allowable to be adjusted of the first gain stage.

10. A calibration method of a multi-gain stage circuit, wherein the multi-gain stage circuit is arranged to receive an input signal to generate an output signal, the multi-gain stage circuit comprises a first gain stage and a second gain stage that are connected in series with each other, the second gain stage generates the output signal; and the calibration method comprises:
   before calibrating an offset voltage of the first gain stage, controlling the first gain stage to have a first gain value so that the output signal is regarded as a product of a gain value of the second gain stage and an offset voltage of the second gain stage; and
   before calibrating the offset voltage of the first gain stage, calculating the offset voltage of the second gain stage according to the output signal, and calibrating the second gain stage according to the offset voltage of the second gain stage.

11. The calibration method of claim 10, wherein the first gain value is a lowest gain value that is allowable to be adjusted of the first gain stage.

12. The calibration method of claim 10, further comprising:
   after the second gain stage is calibrated, controlling the first gain stage to have a highest gain value that is allowable to be adjusted; and
   calculating the offset voltage of the first gain stage according to the output signal, and calibrating the first gain stage according to the offset voltage of the first gain stage.

13. The calibration method of claim 10, wherein the multi-gain stage circuit further comprises a third gain stage; the first gain stage, the second gain stage, and the third gain stage are connected in series with each other, and the third gain stage receives the input signal; and the calibration method further comprises:

after the second gain stage is calibrated, controlling the third gain stage to have a second gain value so that the output signal is regarded as a product of the gain value of the second gain stage, a gain value of the first gain stage, and an offset voltage of the first gain stage; and calculating the offset voltage of the first gain stage according to the output signal, and calibrating the first gain stage according to the offset voltage of the first gain stage.

14. The calibration method of claim 13, further comprising:

after the first gain stage is calibrated, calculating an offset voltage of the third gain stage according to the output signal, and calibrating the third gain stage according to the offset voltage of the third gain stage.

15. The calibration method of claim 10, wherein the multi-gain stage circuit further comprises a third gain stage; the first gain stage, the second gain stage, and the third gain stage are connected in series with each other, and the third gain stage receives the input signal; and the calibration method further comprises:

after the second gain stage is calibrated, controlling the third gain stage to have a second gain value and controlling the first gain stage to have a third gain value, so that the output signal is regarded as a product of the gain value of the second gain stage, the third gain value of the first gain stage, and an offset voltage of the first gain stage; and calculating the offset voltage of the first gain stage according to the output signal, and calibrating the first gain stage according to the offset voltage of the first gain stage.

16. The calibration method of claim 15, wherein the second gain value is a lowest gain value that is allowable to be adjusted of the third gain stage, or the third gain value is a highest gain value that is allowable to be adjusted of the first gain stage.

17. The calibration method of claim 15, further comprising:

after the first gain stage is calibrated, controlling the third gain stage to have a fourth gain value and controlling the first gain stage to have a fifth gain value; and calculating an offset voltage of the third gain stage according to the output signal, and calibrating the third gain stage according to the offset voltage of the third gain stage.

18. The calibration method of claim 17, wherein the fourth gain value is a highest gain value that is allowable to be adjusted of the third gain stage, or the fifth gain value is a highest gain value that is allowable to be adjusted of the first gain stage.

* * * * *